United States Patent
Kim et al.

(10) Patent No.: US 9,825,092 B2
(45) Date of Patent: Nov. 21, 2017

(54) SWITCHING DEVICE, AND RESISTIVE RANDOM ACCESS MEMORY INCLUDING THE SAME AS A SELECTION DEVICE

(71) Applicant: SK hynix Inc., Icheon (KR)

(72) Inventors: Beom Yong Kim, Suwon (KR); Soo Gil Kim, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/154,865

(22) Filed: May 13, 2016

(65) Prior Publication Data
US 2017/0170235 A1    Jun. 15, 2017

(30) Foreign Application Priority Data
Dec. 9, 2015 (KR) .................... 10-2015-0175456

(51) Int. Cl.
*H01L 27/24* (2006.01)
*H01L 45/00* (2006.01)

(52) U.S. Cl.
CPC ........ *H01L 27/2427* (2013.01); *H01L 45/085* (2013.01); *H01L 45/1233* (2013.01); *H01L 45/145* (2013.01); *H01L 45/146* (2013.01)

(58) Field of Classification Search
CPC ............... H01L 27/2427; H01L 45/085; H01L 45/1233; H01L 45/145; H01L 45/146; H01L 45/08

USPC ....... 257/2, 3, 4, 5, 295, 421, 425, E21.001, 257/E27.004, E45.001, E47.001; 438/104, 381, 382
See application file for complete search history.

(56) References Cited

U.S. PATENT DOCUMENTS

| | | | |
|---|---|---|---|
| 7,400,006 B1 * | 7/2008 | Rinerson | G11C 11/5685 257/295 |
| 9,012,878 B1 | 4/2015 | Mathur | |
| 2005/0231992 A1 * | 10/2005 | Rinerson | G11C 11/5678 365/63 |
| 2009/0272959 A1 * | 11/2009 | Phatak | H01L 29/8615 257/2 |
| 2013/0234099 A1 * | 9/2013 | Sekar | G11C 13/0007 257/4 |
| 2013/0264534 A1 | 10/2013 | Hwang et al. | |
| 2015/0188043 A1 * | 7/2015 | Wang | H01L 45/146 257/4 |
| 2015/0255716 A1 * | 9/2015 | Phatak | H01L 29/8615 257/2 |
| 2015/0263069 A1 * | 9/2015 | Jo | H01L 45/085 365/148 |
| 2015/0357566 A1 * | 12/2015 | Wang | H01L 45/165 257/4 |

* cited by examiner

*Primary Examiner* — Dao H Nguyen

(57) ABSTRACT

A switching device includes a first electrode, a switching layer and a second electrode that are disposed over a substrate. The switching layer includes an oxide of a first atom or a nitride of the first atom, and a second atom is doped in the oxide or the nitride. A valence of the first atom and a valence of the second atom are different from each other.

6 Claims, 10 Drawing Sheets

SWITCHING DEVICE, AND RESISTIVE RANDOM ACCESS MEMORY INCLUDING THE SAME AS A SELECTION DEVICE

CROSS-REFERENCE TO RELATED APPLICATION

The present application claims priority under 35 U.S.C 119(a) to Korean Patent Application No. 10-2015-0175456, filed on Dec. 9, 2015, which is herein incorporated by reference in its entirety.

BACKGROUND

1. Technical Field

Various embodiments of the present disclosure relate to a semiconductor memory and, more particularly, to a switching device and a resistive random access memory including the switching device as a selection device.

2. Related Art

A cross-point memory array structure has been employed in a cell region of a memory device. More specifically, the cross-point memory array structure has been included in memories, such as a Resistive Random Access Memory (ReRAM), a Phase Change Random Access memory (PCRAM), a Magnetic Random Access Memory (MRAM), and so on, as a cell structure having a pillar, the pillar being interposed between electrodes disposed on different planes and intersecting with each other.

Meanwhile, in the cross-point memory array structure, there may be writing errors or reading errors on cell information due to a sneak current that occurs between adjacent cells. In order to suppress these errors, a selecting device has been employed in a cell. As the selecting device, switching devices, such as transistors, diodes, tunnel barrier devices, and ovonic threshold switches, have been suggested.

SUMMARY

According to an embodiment, there is provided a switching device. The switching device includes a first electrode, a switching layer and a second electrode that are disposed over a substrate. The switching layer includes an oxide of a first atom or a nitride of the first atom, and a second atom is doped in the oxide or the nitride. A valence of the first atom and a valence of the second atom are different from each other.

According to an embodiment, there is provided a switching device. The switching device includes first and second electrodes disposed to face each other over a substrate. The switching device also includes a switching layer disposed between the first and second electrodes and including an oxide or a nitride. The switching layer includes a plurality of trap sites generated by dopant atoms doped into the oxide or the nitride. The trap sites trap conductive carriers when a voltage whose absolute value is smaller than an absolute value of a predetermined threshold voltage is applied between the first and second electrodes. The trap sites form a moving path through which the conductive carriers move when a voltage whose absolute value is greater than the absolute value of the predetermined threshold voltage is applied between the first and second electrodes.

According to an embodiment, there is provided a resistive memory device. The resistive memory device includes a selection device and a variable resistance device that are disposed over a substrate. The selection device includes a first electrode, a switching layer and a second electrode that are disposed on over substrate. The switching layer includes an oxide of a first atom or a nitride of the first atom and a second atom is doped into the oxide or nitride. A valence of the first atom and a valence of the second atom are different from each other.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

Figure 1:
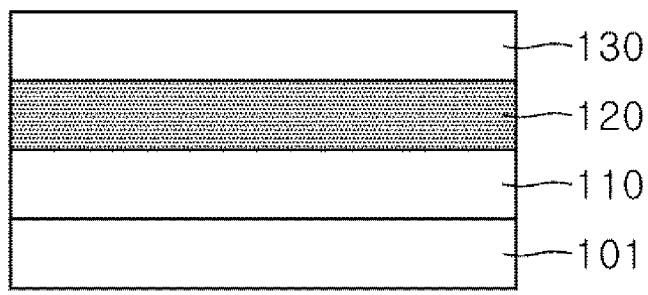
FIG. 1 is a cross-sectional view schematically illustrating a switching device according to an embodiment.

The present disclosure will be described hereinafter with reference to the accompanying drawings, in which embodiments of the invention are shown. In the drawings, the sizes, widths, and/or thicknesses of components may be slightly increased in order to clearly express the components of each device. The drawings are described in the observer's point overall, if an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

A threshold switching operation of a switching device described in this specification will be understood that the switching device sequentially implements a turned-on state and a turned-off state as described below, when an external voltage having a varying absolute value is applied to the switching device. At first, as an absolute value of the external voltage applied to the switching device is gradually increased from an initial state, an operational current of the switching device may be nonlinearly increased after the applied external voltage becomes greater than a predetermined first threshold voltage. This phenomenon can be understood such that the switching device is turned on. After that, as the absolute value of the external voltage applied to the switching device is gradually decreased from the turn-on state of the switching device, the operational current of the switching device may be nonlinearly decreased after the applied external voltage becomes lower than a predetermined second threshold voltage. This phenomenon can be understood such that the switching device is turned off.

FIG. 1 is a cross-sectional view schematically illustrating a switching device 10 according to an embodiment.

Referring to FIG. 1, the switching device 10 includes a first electrode 110, a switching layer 120, and a second electrode 130, which are sequentially stacked on a substrate 101. The switching device 10 may perform a threshold switching operation. The switching device 10 may include an oxide, a nitride, or both, that includes any of a first atom and a second atom in different valence states.

The substrate 101 may be formed of silicon (Si) or gallium arsenic (GaAs), but embodiments are not limited thereto. In another embodiment, the substrate 101 may be formed of ceramic, polymer, or metal, which can be processed by a semiconductor process. The substrate 101 may include integrated circuits formed therein.

Each of the first electrode 110 and the second electrode 130 may include any of a metal, conductive metal nitride, conductive metal oxide, and so on. The first electrode 110 and the second electrode 130 may be formed of the same material or different materials. Each of the first electrode 110 and the second electrode 130 may include any of gold (Au), platinum (Pt), copper (Cu), silver (Ag), ruthenium (Ru), titanium (Ti), iridium (Ir), tungsten (W), titanium nitride (TiN), tantalum (TaN), and so on, and a combination thereof.

The switching layer 120 may be disposed between the first electrode 110 and the second electrode 130. The switching layer 120 may include an oxide of the first atom or a nitride of the first atom. The oxide of the first atom or the nitride of the first atom may have an electrical insulation characteristic.

In an embodiment, the oxide of the first atom may include silicon oxide or metal oxide. The metal oxide may include aluminum oxide, zirconium oxide, hafnium oxide, tungsten oxide, titanium oxide, nickel oxide, copper oxide, manganese oxide, tantalum oxide, niobium oxide, iron oxide or a combination thereof. In some embodiments, the silicon oxide or the metal oxide may have a composition that does not satisfy the stoichiometric ratio. The silicon oxide or the metal oxide may have an amorphous structure. In some embodiments, the nitride of the first atom may include silicon nitride or aluminum nitride. The nitride of the first atom may have an amorphous structure.

The oxide or the nitride of the first atom of the switching layer 120 may be doped with second atoms as dopants. A valence of the second atom may be different from a valence of the first atom. The second atoms may be doped into the oxide or nitride of the first atom to have a uniform concentration distribution. In an embodiment, the second atoms may be doped into the oxide or nitride of the first atom of the switching layer 120 by adding the second atoms as a source material when forming a thin film including the oxide or the nitride of the first atom. In another embodiment, a source gas containing the second atoms may be provided after forming the thin film including the oxide or the nitride of the first atom, and the second atoms may diffuse into the thin film such that the thin film may be doped with the second atoms. In still another embodiment, after forming the thin film including the oxide or nitride of the first atom, the second atoms may be implanted into the thin film by an ion-implantation method. As a result, the thin film may be doped with the second atoms.

In an embodiment, the second atom may act as an N-type or a P-type dopant in the switching layer 120. In an embodiment, when the switching layer 120 includes silicon oxide or silicon nitride, the second atom may include aluminum (Al), lanthanum (La), niobium (Nb), vanadium (V), tantalum (Ta), tungsten (W), chromium (Cr), or molybdenum (Mo). These elements may be used alone or combinations thereof. More specifically, when the switching layer 120 is a silicon oxide layer, aluminum (Al) or lanthanum (La) may be used as the P-type dopant. Alternatively, when the switching layer 120 is a silicon oxide layer, at least one of niobium (Nb), vanadium (V), tantalum (Ta), tungsten (W), chromium (Cr) and molybdenum (Mo) may be used as the N-type dopant.

In another embodiment, when the switching layer 120 includes aluminum oxide or aluminum nitride, the second atom may include titanium (Ti), copper (Cu), zirconium (Zr), hafnium (Hf), niobium (Nb), vanadium (V), tantalum (Ta), tungsten (W), chromium (Cr), or molybdenum (Mo). These elements may be used alone or combinations thereof. The second atom may function as the N-type dopant in the aluminum oxide or the aluminum nitride.

In the above-described structure of the switching device 10, the second atoms doped into the switching layer 120 may form trap sites to trap or conduct conductive carriers that move between the first electrode 110 and the second electrode 130. By trapping or conducting the conductive carries, the switching layer 120 may be in an electrically high-resistance state or an electrically low-resistance state, respectively, and the switching device 10 can maintain a turned-off state or a turned-on state, respectively.

In a specific embodiment, when the switching device 10 maintains the turned-off state, the trap sites trap the conductive carriers, and a current flow by the conductive carriers can be suppressed. On the other hand, when the switching device 10 maintains the turned-on state, the trap sites may function as a source of the conductive carriers, and may form a path through which the conductive carriers move. As the conductive carriers move through the trap sites, a turn-on current of the switching device 10 may be nonlinearly increased.

As long as the switching layer 120 is not broken down by the applied external voltage, the switching device 10 may be in the turned-on state or the turned-off state depending on whether the applied external voltage is greater than a predetermined threshold voltage or not. In addition, the switching layer 120 may have a non-memory characteristic, such that the switching layer 120 recovers the high-resistance state when the applied external voltage is eliminated, i.e., when the external voltage is not applied to the switching device 10. The switching device 10 may act as an electrical switch in an electronic system by the threshold switching operation.

FIGS. 2A, 3A, 4A and 5A are schematic diagrams illustrating operations of the switching device 10 according to an embodiment. FIGS. 2B, 3B, 4B and 5B are graphs schematically illustrating voltage-current characteristics of the switching device 10 according to an embodiment.

Hereinafter, operations of the switching device 10 including an oxide layer doped with N-type dopants as the switching layer 120 will be described. However, embodiments are not limited thereto.

Figure 2A:
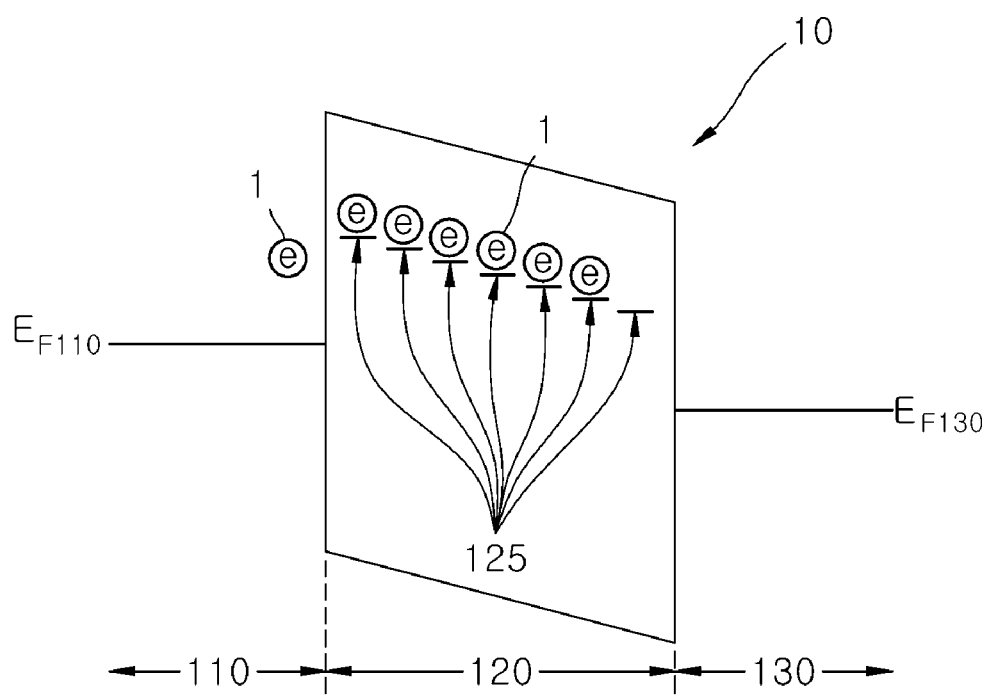
FIGS. 2A, 3A, 4A and 5A are schematic diagrams illustrating operations of a switching device according to an embodiment.
Figure 2B:
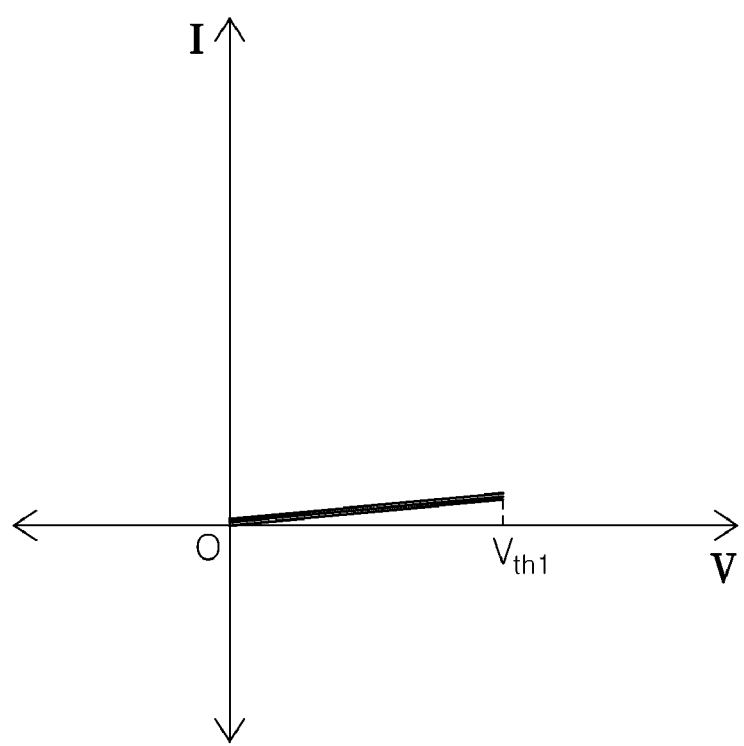
FIGS. 2B, 3B, 4B and 5B are graphs illustrating voltage-current characteristics of a switching device according to an embodiment.

Referring to FIGS. 2A and 2B, the switching device 10 including a stack structure of the first electrode 110, the switching layer 120, and the second electrode 130, is provided. Each of the first electrode 110 and the second electrode 130 may include a noble metal such as platinum (Pt), silver (Ag), or the like, but embodiments are not limited thereto. In another embodiment, any of a conductive metal nitride and a conductive metal oxide may be employed as a material for the first electrode 110 and the second electrode 130.

Referring to FIG. 2A, when an external voltage is applied between the first electrode 110 and the second electrode 130, a negative bias is applied to the first electrode 110, and a positive bias is applied to the second electrode 130. By the external voltage applied between the first electrode 110 and the second electrode 130, an energy band may be bent so that the Fermi level ($E_{F110}$) of the first electrode 110 is above the Fermi level ($E_{F130}$) of the second electrode 130. At this time, electrons 1 may be introduced into the switching layer 120 from the first electrode 110.

When the external voltage is lower than a predetermined threshold voltage $V_{th1}$ and is applied to the switching device 10, the electrons 1 introduced into the switching layer 120 may be trapped in trap sites 125 formed by the N-type dopants. At this time, an electric field may be generated in the switching layer 120 by the external voltage. Since, however, the external voltage is lower than the threshold voltage $V_{th1}$, the electric field may not be strong enough to sufficiently de-trap the electrons 1 trapped in the trap sites 125 and to conduct the electrons 1 to the second electrode 130.

Meanwhile, as the electrons 1 trapped in the trap sites 125 have negative charges, each of the electrons 1 may act an electrostatic repulsive force on other electrons therearound. Therefore, introduction of other electrons into the switching layer 120 from the first electrode 110 may be suppressed, or movement of other electrons in the switching layer 120 may be suppressed, due to the electrostatic repulsive force. As a result, only some of the electrons 1 introduced into the switching layer 120 may move to the second electrode 130 along the trap sites 125, which may generate a leakage current.

FIG. 2B illustrates that the conduction of the electrons 1 in the switching layer 120 is suppressed when the external voltage is lower than the predetermined threshold voltage $V_{th1}$ and is applied to the switching device 10 of FIG. 2A. Thus, the switching device 10 of FIG. 2A shows a high-resistance characteristic such that a relatively low current flows through the switching layer 120. As such, the switching device 10 of FIG. 2A may maintain a turned-off state when the external voltage is lower than the predetermined threshold voltage $V_{th1}$ and is applied thereto.

Figure 3A:
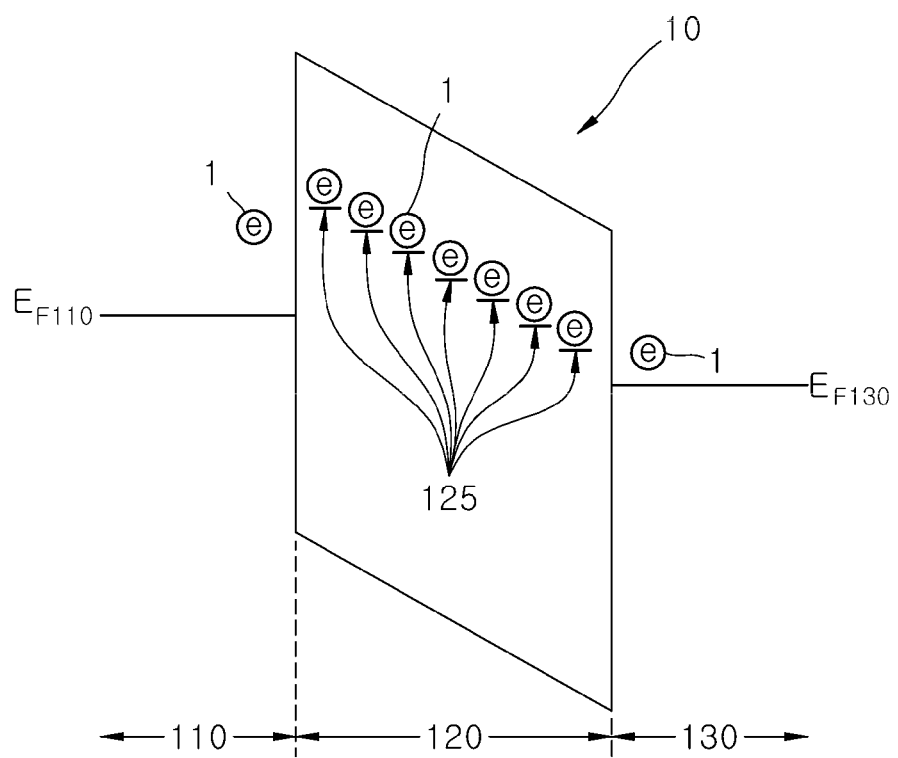

Referring to FIG. 3A, when the external voltage is greater than the predetermined threshold voltage $V_{th1}$ and is applied between the first electrode 110 and the second electrode 130, the energy band may be further bent by the applied external voltage, compared to the energy band shown in FIG. 2A. At this time, an electric field may be generated in the switching layer 120 by the applied external voltage that is greater than the threshold voltage $V_{th1}$, and the electric field may be strong enough to sufficiently de-trap the electrons 1 trapped by the trap sites 125 and to conduct the electrons 1 to the second electrode 130. The trap sites 125 may act as a source that provides the electrons 1 as conductive carriers, and may form a moving path of the electrons 1 between terminals of the applied external voltage that is greater than the threshold voltage $V_{th1}$. More specifically, the electrons 1 may be conducted to the second electrode 130 from the trap sites 125 by tunneling, or may be conducted to the second electrode 130 via some of the trap sites 125, by the applied external voltage.

Figure 3B:
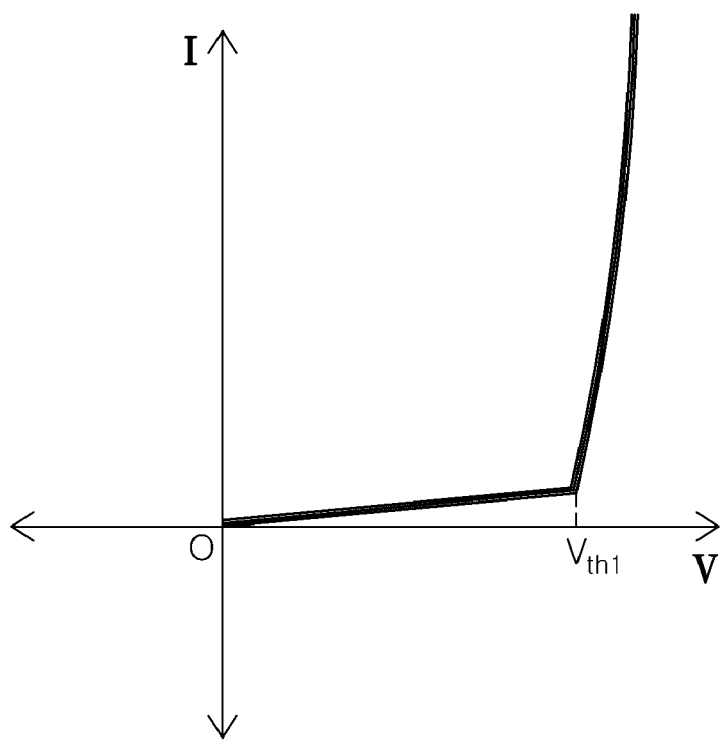

FIG. 3B illustrates that the conduction of the electrons 1 is activated in the switching layer 120 when the external voltage is greater than the predetermined threshold voltage $V_{th1}$ and is applied to the switching device 10 of FIG. 3A. Thus, the switching device 10 of FIG. 3A shows a low-resistance characteristic, such that a relatively high current flows through the switching layer 120. The switching device 10 of FIG. 3A may show a non-linearly increasing voltage-current characteristic when the external voltage is greater than the threshold voltage $V_{th1}$ and is applied thereto. As a result, the switching device 10 of FIG. 3A may maintain a turned-on state when the external voltage is greater than the predetermined threshold voltage $V_{th1}$ and is applied thereto.

Meanwhile, as shown in FIG. 3B, if a value of the external voltage applied to the switching device 10 in the turned-on state is decreased, an operational current may be decreased. Thus, when the applied external voltage is decreased to a voltage that is lower than the predetermined threshold voltage $V_{th1}$, the operational current of the switching device 10 may be non-linearly decreased. As a result, after the external voltage applied to the switching device 10 is eliminated, the switching layer 120 may recover the high-resistance characteristic described above in connection with FIGS. 2A and 2B.

Figure 4A:
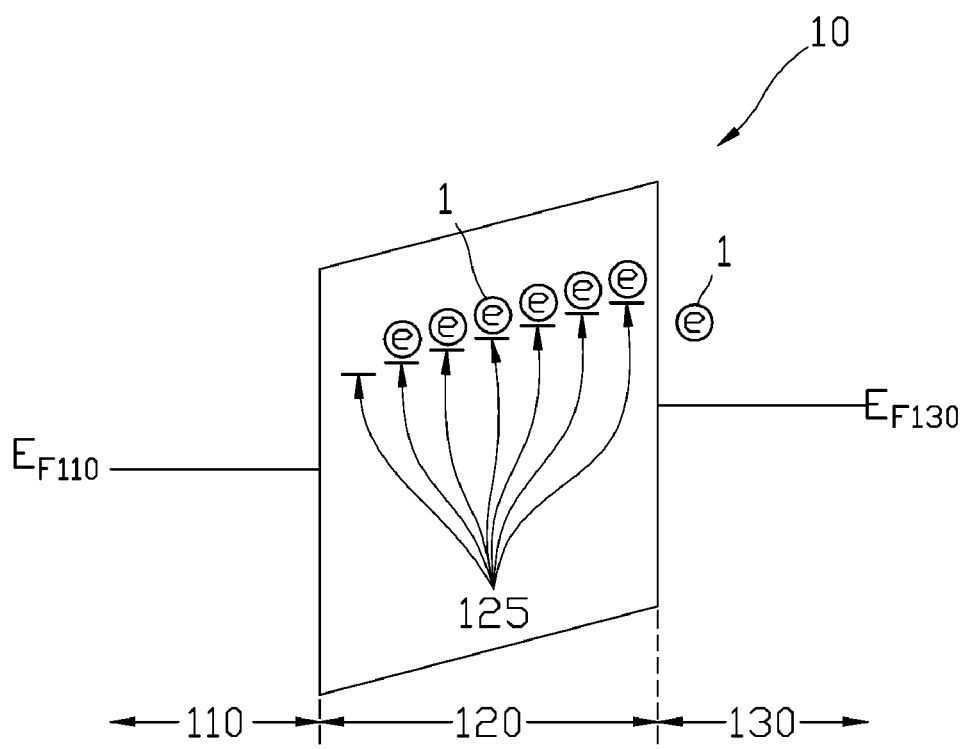
Figure 4B:
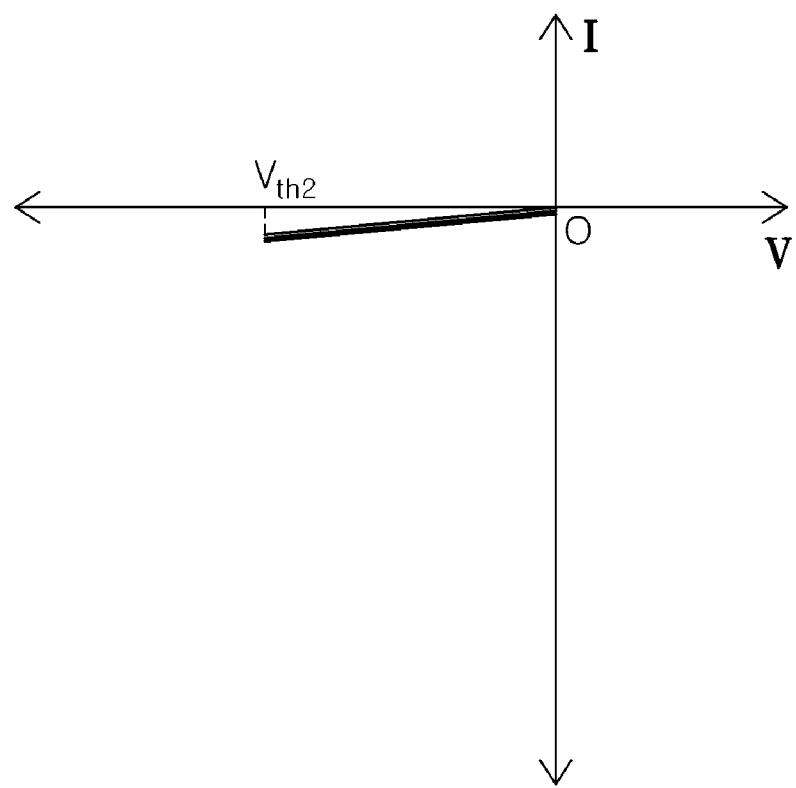

Referring to FIGS. 4A and 4B, when the external voltage is applied between the first electrode 110 and the second electrode 130, a positive bias may be applied to the first electrode 110, and a negative bias may be applied to the second electrode 130. That is, the external voltage may be applied in an opposite direction to the case shown in FIGS. 2A and 2B. In this case, as illustrated in FIG. 4B, an absolute value of the applied external voltage may be increased from 0 V, and may be applied in a negative direction.

As illustrated in FIG. 4A, the energy band may be bent so that the Fermi level $E_{F130}$ of the second electrode 130 is raised above the Fermi level $E_{F110}$ of the first electrode 110 by the applied external voltage. At this time, electrons 1 may be introduced into the switching layer 120 from the second electrode 130.

When the absolute value of the applied external voltage is smaller than an absolute value of a predetermined threshold voltage $V_{th2}$, the electrons 1 introduced into the switching layer 120 may be trapped in trap sites 125 formed by N-type dopants. Thus, an electric field may be formed in the switching layer 120 by the applied external voltage whose absolute value is smaller than the absolute value of the threshold voltage $V_{th2}$. However, at this time, since the electric field may not be strong enough to sufficiently de-trap the electrons 1 trapped in the trap sites 125, the electrons 1 are not conducted to the first electrode 110.

Meanwhile, since the electrons 1 trapped in the trap sites 125 have negative charge, the electrons 1 may act an electrostatic repulsive force to other electrons therearound. Accordingly, introduction of other electrons into the switching layer 120 from the second electrode 130 may be suppressed, or movement of other electrons in the switching layer 120 may be suppressed due to the electrostatic repulsive force.

As a result, only some of the electrons 1 introduced into the switching layer 120 may move to the first electrode 110 along the trap sites 125, which may generate a leakage current having a predetermined level.

FIG. 4B illustrates that conduction of the electrons 1 in the switching layer 120 is suppressed when the external voltage that has the absolute value that is smaller than the absolute value of the threshold voltage $V_{th2}$ is applied to the switching device 10 of FIG. 4A. Thus, the switching device 10 of FIG. 4A shows a high-resistance characteristic such that a relatively low current flows through the switching layer 120. As such, the switching device 10 of FIG. 4A may maintain a turned-off state when the external voltage that has the absolute value that is smaller than the absolute value of the predetermined threshold voltage $V_{th2}$ is applied thereto.

Figure 5A:
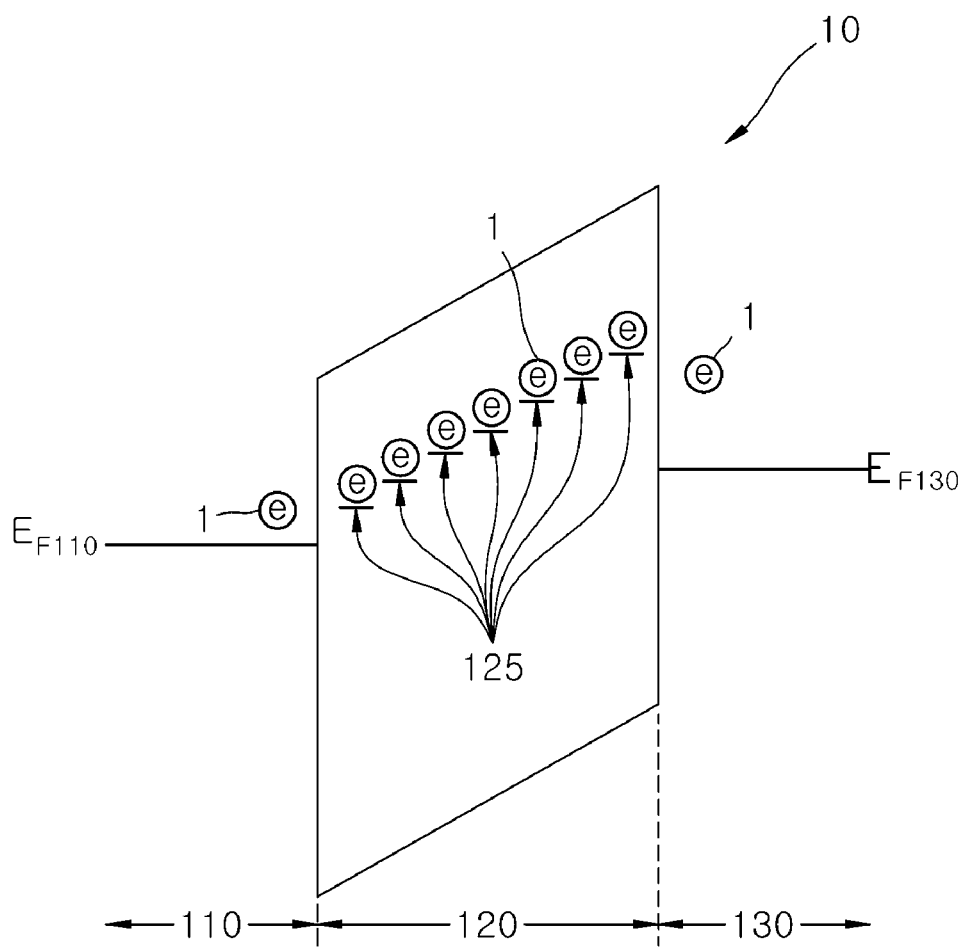

Referring to FIG. 5A, when the external voltage that has the absolute value that is greater than the absolute value of the predetermined threshold voltage $V_{th2}$ is applied between the first electrode 110 and the second electrode 130, the energy band may be further bent by the applied external voltage, compared to the energy band shown in FIG. 4A. At this time, an electric field may be generated in the switching layer 120 by the applied external voltage whose absolute value is greater than that of the threshold voltage $V_{th2}$. The electric field may be sufficiently strong to de-trap the electrons 1 trapped in the trap sites 125 and to conduct the electrons 1 to the first electrode 110. The trap sites 125 may act as a source that provides the electrons 1 as conductive carriers, and may form a moving path of the electron 1 at the applied external voltage having the absolute value that is greater than that of the threshold voltage $V_{th2}$. More specifically, the electrons 1 may be conducted to the first electrode 110 from the trap sites 125 by tunneling, or may be conducted to the first electrode 110 via some of trap sites 125, by the applied external voltage.

Figure 5B:
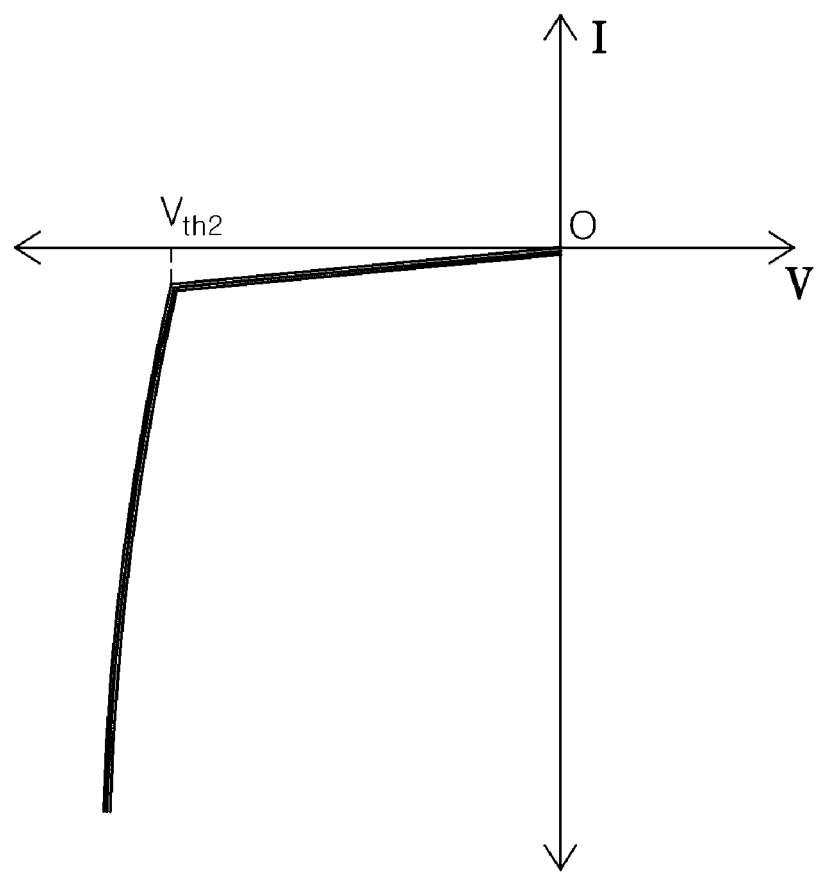

FIG. 5B illustrates that, when the external voltage that has the absolute value greater than that of the predetermined threshold voltage $V_{th2}$ is applied to the switching device 10 of FIG. 5A, conduction of the electrons 1 is activated in the switching layer 120 of FIG. 5A. Thus the switching device 10 of FIG. 5A shows a low-resistance characteristic such that a relatively high current flows through the switching layer 120. The switching device 10 of FIG. 5A may show a non-linearly increasing voltage-current characteristic when the external voltage that has the absolute value that is greater than that of the predetermined threshold voltage $V_{th2}$ is applied thereto. As a result, the switching device 10 of FIG. 5A may maintain a turned-on state when the external voltage that has the absolute value that is greater than that of the predetermined threshold voltage $V_{th2}$ is applied thereto.

Referring to FIG. 5B, when an absolute value of the voltage applied to the switching device 10 is reduced from the absolute value at which the switching device 10 is in the turned-on state, an operational current may be decreased. Thus, when the applied external voltage is decreased to a voltage whose absolute value is smaller than the absolute value of the predetermined threshold voltage $V_{th2}$, the switching device 10 may represent a characteristic that the operational current of the switching device 10 is non-linearly decreased. As a result, after the is applied external voltage is eliminated, the switching layer 120 of FIG. 5A may recover the high-resistance characteristic described above in connection with FIGS. 4A and 4B.

Although it is described that the N-type dopants are doped in the insulating oxide in the above-described embodiment, P-type dopants may be doped in the insulating oxide in another embodiment. In this case, the P-type dopants may function as trap sites for recombination of electrons, that is, conductive carriers, in the switching layer 120. That is, the P-type dopants may recombine the electrons and suppress conduction by the electrons when a voltage whose absolute value is smaller than that of a predetermined threshold voltage is applied to the switching device 10. The conduction of the electrons occurs when a voltage whose absolute value is greater than that of the predetermined threshold voltage is applied to the switching device 10. The electrons may be conducted by tunneling between the first electrode 110 of FIG. 5A and the second electrode 130 of FIG. 5A, and thus a relatively high turn-on current may be generated at the voltage whose absolute value is greater than that of the predetermined threshold voltage.

In addition, unlike the above description, insulating nitride may be employed as the switching layer 120 of FIG. 5A. In this embodiment, N-type dopants or P-type dopants may be doped into the insulating nitride. The N-type dopants or P-type dopants may function as trap sites for electrons in the switching layer 120 of FIG. 5A.

As described above, in a switching device according to an embodiment of the present disclosure, conductive carriers may be trapped in trap sites in a switching layer or may be trapped but can be conducted between electrodes according to an absolute value of an applied external voltage. The trap sites may suppress conduction of the conductive carriers when a voltage that has an absolute value that is smaller than that of a predetermined threshold voltage is applied to the switching device. The trap sites may function as a source the conductive carriers, and may form a moving path through which the conductive carriers move when a voltage that has an absolute value that is greater than that of the predetermined threshold voltage is applied to the switching device. Through this, the switching device can perform a threshold switching operation such that an operational current property is reversibly changed based on the predetermined threshold voltage.

Figure 6:
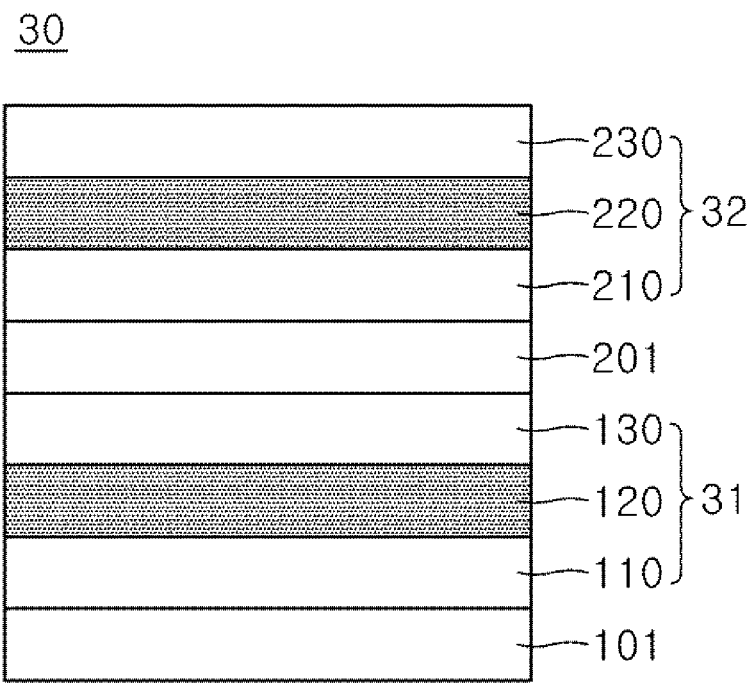
FIG. 6 is a cross-sectional view schematically illustrating a resistive memory device according to an embodiment.

FIG. 6 is a cross-sectional view schematically illustrating a resistive random access memory (hereinafter referred to as "resistive memory") device 30 according to an embodiment. In FIG. 6, the same reference numerals as in FIG. 1 may refer to the same elements as in FIG. 1.

Referring to FIG. 6, the resistive memory device 30 may include a selection device 31 and a variable resistance device 32 that are formed on a substrate 101. The variable resistance device 32 may function as a nonvolatile memory element. The selection device 31 may be coupled to the variable resistance device 32, and may prevent generation of information errors due to a leakage current occurring among a plurality of cells of the resistive memory device.

The substrate 101 may be formed of silicon (Si) or gallium arsenic is (GaAs), but embodiments are not limited thereto. In another embodiment, the substrate 101 may be formed of a material, e.g., ceramic, polymer, or metal, which can be processed by a semiconductor process. The substrate 101 may include integrated circuits formed therein.

The selection device 31 may employ the above-described switching device 10 FIG. 1 according to an embodiment. Thus, in this embodiment, the selection device 31 includes a first electrode 110, a switching layer 120, and a second electrode 130. Each of the first electrode 110 and the second electrode 130 may include a conductive metal nitride, conductive metal oxide, or the like. The switching layer 120 may include an oxide or nitride of a first atom. In addition, the switching layer 120 may include a second atom as a dopant doped in the oxide or nitride. In this embodiment, the valence of the first atom and the valence of the second atom may be different from each other.

As described above, the second atom may form a trap site for a conductive carrier in the switching layer 120. When an external voltage is applied between the first electrode 110 and the second electrode 130, the trap site may function to suppress movement of the conductive carrier if the applied external voltage has an absolute value smaller than an absolute value of a predetermined threshold voltage, and may function as a source of the conductive carrier, and may form a moving path of the conductive carrier if the applied external voltage has an absolute value greater than the absolute value of the predetermined threshold voltage. Through this, the selection device 31 may perform a threshold switching operation such that an operational current property is reversibly changed based on the predetermined threshold voltage. In addition, when the applied external voltage is eliminated, the selection device 31 may show a non-memory characteristic since the switching layer 120 recovers a high-resistance state.

A diffusion barrier layer 201 may be disposed between the selection device 31 and the variable resistance device 32. In an embodiment, the diffusion barrier layer 201 may be disposed on the second electrode 130 of the selection device 31. The diffusion barrier layer 201 may function to suppress diffusion of materials between the selection device 31 and the variable resistance device 32. In some embodiments, when thermal or chemical stabilities of the materials constituting the selection device 31 and the variable resistance device 32 are secured, the diffusion barrier layer 201 may be omitted.

The variable resistance device 32 may be disposed on the diffusion barrier layer 201. The variable resistance device 32 may include a first memory electrode 210, a resistance change memory layer 220, and a second memory electrode 230. In an embodiment, the resistance change memory layer 220 may include a metal oxide such as titanium oxide ($TiO_{2-x}$), aluminum oxide ($Al_2O_3$), nickel oxide ($NiO_x$), copper oxide ($Cu_xO$), zirconium oxide ($ZrO_2$), manganese oxide ($MnO_2$), hafnium oxide ($HfO_2$), tungsten oxide ($WO_3$), tantalum oxide ($Ta_2O_{5-x}$), niobium oxide ($Nb_2O_5$), iron oxide ($Fe_3O_4$), or the like. In another embodiment, the resistance change memory layer 220 may include a perovskite material such as $PCMO(Pr_{0.7}Ca_{0.3}MnO_3)$, LCMO ($La_{1-x}Ca_xMnO_3$), $BSCFO(Ba_{0.5}Sr_{0.5}Co_{0.8}Fe_{0.2}O_{3-\delta})$, YBCO ($YBa_2Cu_3O_{7-x}$), $(Ba,Sr)TiO_3(Cr, Nb\text{-doped})$, $SrZrO_3(Cr,V\text{-doped})$, $(La, Sr)MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, or the like. In still another embodiment, the resistance change memory layer 220 may include a material of a selenide series such as $Ge_xSe_{1-x}(Ag,Cu,Te\text{-doped})$, or a metal sulfide such as $Ag_2S$, $Cu_2S$, CdS, ZnS, or the like.

Each of the first memory electrode 210 and the second memory electrode 230 of the variable resistance device 32 may include a metal, nitride, conductive oxide, or the like. Each of the first memory electrode 210 and the second memory electrode 230 may include one selected from gold (Au), platinum (Pt), copper (Cu), silver (Ag), ruthenium (Ru), titanium (Ti), iridium (Ir), tungsten (W), titanium nitride (TiN), tantalum nitride (TaN), and a combination thereof.

In some embodiments, the diffusion barrier layer 201 and the first memory electrode 210 may be omitted, and, instead, the second electrode 130 of the selection device 31 may function as the first memory electrode 210 of the variable resistance device 32.

As described above, according to an embodiment, a resistive memory device may include a selection device having a voltage-current characteristic, such that an operational current property is reversibly changed based on whether an external voltage is greater than or less than a threshold voltage. In addition, the selection device may show a non-memory characteristic as a switching layer therein recovers a high-resistance state when the external voltage applied to the selection device is eliminated.

In the above-described structure of the selection device, the second atoms doped in the oxide or nitride of the first atom may form trap sites to trap or to conduct the conductive carriers to move between the first electrode and the second electrode of the selection device. More specifically, when the selection device maintains the turned-off state, i.e., when a voltage that has an absolute value that is smaller than an absolute value of the threshold voltage is applied to the selection device, the trap sites can efficiently suppress a current flow in the selection device by trapping the conductive carriers. On the other hand, when the selection device maintains the turned-on state, i.e., when a voltage that has an absolute value that is greater than that of the threshold voltage is applied to the selection device, the trap sites may function as a source that provides conductive carriers and may form a moving path of the conductive carriers. Accordingly, the turn-on current of the selection device may be non-linearly increased by the conductive carriers conducted through the trap sites.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A switching device, comprising:
   first and second electrodes disposed to face each other over a substrate;
   a switching layer disposed between the first and second electrodes and including an oxide or a nitride, and
   a plurality of trap sites in the switching layer, the plurality of trap sites being generated by dopant atoms doped into the oxide or the nitride,
   wherein the trap sites trap electrons, the trapped electrons suppressing the movement of the other electrons through the trap sites by exerting an electrostatic repulsive force on the other electrons,
   wherein an operation current nonlinearly decreases when the switching layer switches to a turned-off state, the switching layer switching to the turned-off state when an absolute value of a varying external voltage is smaller than an absolute value of a predetermined threshold voltage, the varying external voltage being applied between the first and second electrodes, and
   wherein the trap sites form a moving path through which electrons de-trapped from the trap sites move and the operation current nonlinearly increases when the switching layer switches to a turned-on state from the turned-off state, the switching layer switching to the turned-on state when the absolute value of the varying external voltage is greater than the absolute value of the predetermined threshold voltage.

2. The switching device of claim 1, wherein the switching layer comprises any one of silicon oxide, silicon nitride, metal oxide, and metal nitride.

3. The switching device of claim 2, wherein the metal oxide comprises at least one selected from aluminum oxide, zirconium oxide, hafnium oxide, tungsten oxide, titanium oxide, nickel oxide, copper oxide, manganese oxide, tantalum oxide, niobium oxide, and iron oxide.

4. The switching device of claim 1, wherein the switching device recovers an electrically high-resistance state when a voltage is not applied thereto.

5. The switching device of claim 1, wherein a valence of the dopant atom is different from a valence of an atom of the oxide or a valence of an atom of the nitride.

6. The switching device of claim 1, wherein the second electrode is disposed between a memory element and the switching layer.

* * * * *